(12) United States Patent
Chiba et al.

(10) Patent No.: US 6,280,900 B1
(45) Date of Patent: Aug. 28, 2001

(54) RADIATION-SENSITIVE RESIN COMPOSITION

(75) Inventors: Takashi Chiba, Austin, TX (US); Jun Numata, Yokkaichi (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/558,068

(22) Filed: Apr. 26, 2000

(30) Foreign Application Priority Data

Apr. 26, 1999 (JP) .................................................. 11-118758

(51) Int. Cl.$^7$ ...................................................... G03F 7/039
(52) U.S. Cl. ........................ 430/270.1; 430/905; 430/910
(58) Field of Search ................................. 430/270.1, 905, 430/910

(56) References Cited

U.S. PATENT DOCUMENTS

| | | | | |
|---|---|---|---|---|
| 5,478,690 | * | 12/1995 | Kanda et al. | 430/175 |
| 5,492,793 | * | 2/1996 | Breyta et al. | 30/270.14 |
| 5,556,734 | * | 9/1996 | Yamachika et al. | 430/270.1 |
| 5,679,495 | * | 10/1997 | Yamachika et al. | 430/191 |
| 5,759,739 | * | 6/1998 | Takemura et al. | 430/270.1 |
| 5,916,728 | * | 6/1999 | Fukui et al. | 430/170 |
| 5,962,184 | * | 10/1999 | Allen et al. | 430/270.1 |
| 5,962,186 | * | 10/1999 | Park et al. | 430/270.1 |
| 6,040,112 | * | 3/2000 | Tako et al. | 430/270.1 |
| 6,114,422 | * | 9/2000 | Choi | 547/247 |

\* cited by examiner

*Primary Examiner*—John S. Chu
(74) *Attorney, Agent, or Firm*—Piper, Marbury, Rudnick & Wolfe, LLP; Steven B. Kelber

(57) ABSTRACT

A radiation-sensitive resin composition comprising (a) a resin represented by a copolymer of p-hydroxystyrene and t-butyl (meth)acrylate and a copolymer of p-hydroxystyrene and p-t-butoxystyrene, (b) a photoacid generator, and (c) a quaternary ammonium salt compound represented by tetramethylammonium adamantanecarboxylate, tetramethylammonium oxalate, tetraethylammonium pyruvate. The radiation-sensitive resin composition is capable of producing a rectangular resist pattern while preventing the top edge of the pattern from rounding, which is a big problem in microprocessing of design dimensions of about 0.20 μm with a thin film. The radiation-sensitive resin composition is highly sensitive to deep ultraviolet radiation, X-rays, and charged particle rays and exhibits excellent sensitivity, resolution, and the like.

10 Claims, 1 Drawing Sheet

RADIATION-SENSITIVE RESIN COMPOSITION

BACKGROUND OF THE INVENTION

1. Field of the Invention

The present invention relates to a radiation-sensitive resin composition. More particularly, the present invention relates to a radiation-sensitive resin composition suitable as a resist for ultra-microprocessing utilizing various types of radiation such as ultraviolet radiation, deep ultraviolet radiation, X-rays, and charged particle rays.

2. Description of Background Art

In the field of microprocessing represented by the production of integrated circuit elements, lithographic technology capable of performing microprocessing of sub half-micron order or less with good reproducibility has been developed in order to increase integration of the integrated circuits.

In a conventional lithographic process, a positive-tone resist using an alkali-soluble resin such as a novolac resin and a quinonediazido photosensitizer is typically used as a resist. A negative-tone resist is also known as such a resist. Since performance of these types of resists has almost reached a limit, it is difficult to use these resists in microprocessing of a sub half-micron order or less. In a conventional lithographic process utilizing ultraviolet radiation such as g-rays(wavelength: 436nm) and i-rays (wavelength: 365nm) from a mercury lamp, sufficient theoretical depth of focus cannot be achieved in the case of forming a minute pattern of 0.35 $\mu$m or less by using the above positive-tone resist.

Therefore, a lithographic process utilizing deep ultraviolet radiation, X-rays, or charged particles rays capable of achieving a wider range of depth of focus has been studied in order to produce a minute pattern of 0.35 $\mu$m or less.

However, conventional resists have problems related to pattern shape, sensitivity, contrast, developability, and the like, when using deep ultraviolet radiation, X-rays, or charged particle rays. In the case of deep ultraviolet radiation, the shape of the pattern produced using a negative-tone resist tends to become an "inverted tapered-shape", in which the bottom of the pattern is thinner than the top, due to too great light absorption of the resist. The resist pattern produced using a positive-tone resist also becomes a tapered-shape, in which the bottom of the pattern is thicker than the top. Therefore, it is difficult to form a rectangular pattern in both cases.

Moreover, sensitivity, contrast, and the like are inadequate. In the case of using radiation having higher energy such as X-rays or charged particle rays, decrease in the sensitivity is more significant than in the case of using deep ultraviolet radiation. In particular, a positive-tone resist of which the solubility in a developer should otherwise increase upon irradiation of an energy ray, becomes less soluble when irradiated by such a higher energy radiation.

In view of the above situation, a chemically-amplified resist comprising a photoacid generator (a compound which generates acid upon irradiation) has attracted attention as an advanced resist. The chemically-amplified resist has excellent sensitivity to various types of radiation by the catalytic action of acid generated.

As such a chemically-amplified resist exhibiting comparatively good resist performance, a resist comprising a resin having a t-butyl ester group or a t-butoxycarbonyl group (for example, Japanese Patent Publication No. 27660/1990), a resist comprising a resin having a silyl group (for example, Japanese Patent Publication No. 44290/1991), a resist comprising a resin having an acrylic acid component (for example, Japanese Patent Application Laid-open No. 39665/1992), and the like are known. However, these chemically-amplified resists have their own peculiar problems and various difficulties in practical application. One of the problems which has recently been pointed out is a round edge of the top portion which is produced during microprocessing of a thin film with a design dimension of about 0.20 $\mu$m.

As a radiation-sensitive resin composition for chemically-amplified resists, Japanese Patent Application Laid-open No. 127700/1997 discloses a composition comprising a water-insoluble organic polymer binder, such as a 4-hydroxystyrene/4-tetrahydropyranyloxystyrene copolymer, which comprises an acid unstable group and becomes soluble in an alkali aqueous solution by the action of an acid, and a quaternary ammonium salt compound such as quaternary ammonium organic acid salt as a composition exhibiting improved photosensitivity, processing characteristics, and contrast. Moreover, Japanese Patent Application Laid-open No. 179303/1997 discloses that the photo speed can be controlled by the use of a composition comprising a resin binder such as a hydroxystyrene/t-butyl (meth)acrylate copolymer which comprises an acid unstable group and a quaternary ammonium salt compound such as quaternary ammonium hydroxyalkanoyl. In particular, Japanese Patent Application Laid-open No. 179303/1997 discloses that superior performance can be obtained by using hydroxy-substituted alkanoyl as the counter ion of the quaternary ammonium salt compound, in comparison with the case of using alkanoyl without hydroxy-substitution.

However, these compositions are still inadequate from the viewpoint of preventing the top edge of the pattern from rounding, which is the big problem in microprocessing of design dimensions of about 0.20 $\mu$m with a thin film.

Therefore, development of a chemically-amplified resist exhibiting excellent sensitivity and resolution capable of preventing the top edge of the pattern from rounding in microprocessing with a thin film is strongly demanded.

An object of the present invention is to provide a radiation-sensitive resin composition capable of producing a rectangular resist pattern while preventing the top edge of the pattern from rounding, which is a big problem in microprocessing of design dimensions of about 0.20 $\mu$m with a thin film of, for example, 0.6 $\mu$m or less.

Another object of the present invention is to provide a radiation-sensitive resin composition which is highly sensitive to deep ultraviolet radiation, X-rays, and charged particle rays, and exhibits excellent sensitivity, resolution, and the like.

SUMMARY OF THE INVENTION

According to the present invention, the above objects can be achieved by a radiation-sensitive resin composition comprising:

(a) the following copolymer (a-1) or copolymer (a-2), or a mixture of the copolymer (a-1) and copolymer (a-2):

copolymer (a-1): a copolymer (I) which comprises a recurring unit shownby the following formula (1) and a recurring unit shown by the following formula (2),

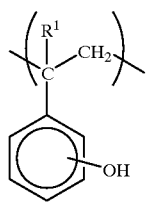

(1)

wherein $R^1$ represents a hydrogen atom or a methyl group,

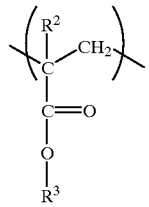

(2)

wherein $R^2$ represents a hydrogen atom or a methyl group, and $R^3$ represents a t-butyl group or a group shown by the following formula (3),

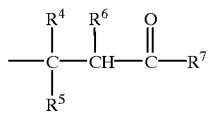

(3)

wherein $R^4$ and $R^5$ individually represent a hydrogen atom, a linear orbranched alkyl group having 1–6 carbon atoms, ora 5–8membered cyclic alkyl group; or $R^4$ and $R^5$ forma 5–8 membered carbon cyclic structure in combination together with the carbon atom of the formula (3), and $R^6$ and $R^7$ individually represent a hydrogen atom, a linear or branched alkyl group having 1–6 carbon atoms, or a 5–8 membered cyclic alkyl group, or $R^6$ and $R^7$ form a 5–8 membered carbon cyclic structure in combination with the carbon atom of the formula (3);

copolymer (a-2): a copolymer (II) which comprises a recurring unit shown by the above formula (1) and a recurring unit shown by the following formula (4),

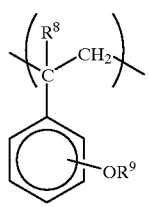

(4)

wherein R8 represents a hydrogen atom or a methyl group, and $R^9$ represents a tertiary alkyl group having 4–10 carbon atoms;

(b) a photoacid generator; and (c) a compound shown by the following formula (5),

(5)

wherein $R^{10}$, $R^{11}$, $R^{12}$, and $R^{13}$ individually represent a linear, branched, or cyclic alkyl group having 1–16 carbon atoms, a linear, branched, or cyclic alkenyl group having 2–16 carbon atoms, an aryl group having 6–15 carbon atoms, or an aralkyl group having 7–12 carbon atoms; or two of $R^{10}$, $R^{11}$, $R^{12}$, and $R^{13}$ form a 5–8 membered heterocyclic structure in combination with the nitrogen atom of the formula (5), and the other two individually represent a linear, branched, or cyclic alkyl group having 1–16 carbon atoms, a linear, branched, or cyclic alkenyl group having 2–16 carbon atoms, an aryl group having 6–15 carbon atoms or an aralkyl group having 7–12 carbon atoms; and $R^{14}$ represents a monovalent hydrocarbon group having 5–16 carbon atoms, an acyl group or carboxyl group having 2–16 carbon atoms, or a group in which a monovalent hydrocarbon group having 1–16 carbon atoms is replaced by a carboxyl group.

DETAILED DESCRIPTION OF THE INVENTION AND PREFERRED EMBODIMENT

Figure 1:
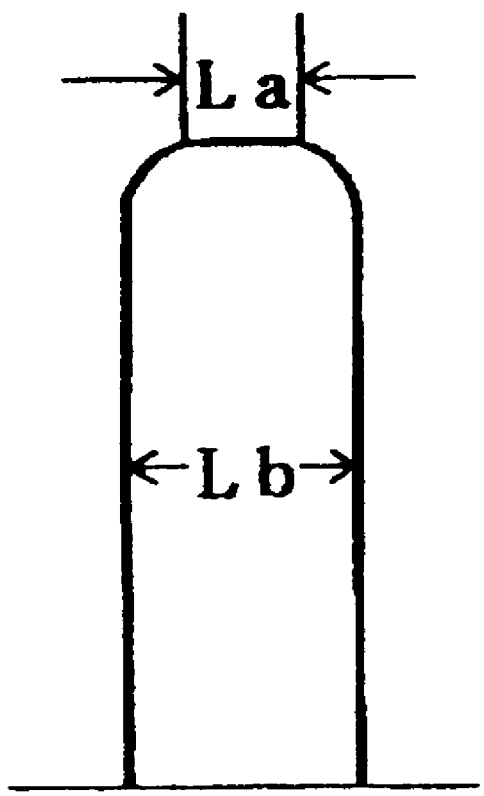
FIG. 1 shows an evaluation procedure of a pattern shape.

The present invention will be described in detail below.
Component (a)

The component (a) of the present invention comprises (I) a copolymer comprising a recurring unit shown by the above formula (1) (hereinafter referred to as "recurring unit (1)") and a recurring unit shown by the above formula (2) (hereinafter referred to as "recurring unit (2)") (hereinafter referred to as "copolymer (a-1)"), and/or (II) a copolymer comprising the recurring unit (1) and a recurring unit shown by the above formula (4) (hereinafter referred to as "recurring unit (4)") (hereinafter referred to as "copolymer (a-2)") (these copolymers may be together called "resin (a)").

In the case of using both the copolymer (a-1) and the copolymer (a-2) as the resin (a), these copolymers may be mixed in optional proportions.

Each of the copolymer (a-1) and the copolymer (a-2) may comprise both the recurring unit (1) having a hydrogen atom for $R^1$ and the recurring unit (1) having a methyl group for $R^1$ at the same time.

The recurring unit (1) having a hydrogen atom for $R^1$ comprises at least one recurring unit produced by the cleavage of the polymerizable unsaturated bond of o-hydroxystyrene, m-hydroxystyrene, orp-hydroxystyrene. The recurringunit (1) having a methyl group for $R^1$ comprises at least one recurring unit produced by the cleavage of the polymerizable unsaturated bond of o-hydroxy-α-methylstyrene, m-hydroxy-a-methylstyrene, or p-hydroxy-α-methylstyrene.

The proportion of the recurring unit (1) to all the recurring units in the copolymers (a-1) and (a-2) is preferably 10–90 wt %, and still more preferably 30–90 wt %. If the proportion of the recurring unit (1) is less than 10 wt %, adhesion to substrates may decrease, causing the resist pattern to peel off. If the proportion exceeds 90 wt %, the difference in solubility in an alkaline developer between the irradiated area and the unirradiated area is small, whereby the resolution tends to decrease.

The copolymer (a-1) may comprise both the recurring unit (2) having a hydrogen atom for $R^2$ and the recurring unit (2) having a methyl group for $R^2$ in the above formula (2) at the same time. Moreover, the copolymer (a-1) may comprise both the recurring unit (2) having a t-butyl group for $R^3$ in the formula (2) and the recurring unit (2) shown by the above formula (3) at the same time.

$R^4$, $R^5$, $R^6$, and $R^7$ in the formula (3) are preferably a hydrogen atom or a linear or branched alkyl group having 1–3 carbon atoms. As the 5–8 membered carbon cyclic structure in which $R^4$ and $R^5$ bond and the 5–8 membered carbon cyclic structure in which $R^6$ and $R^7$ bond, a 5–6 membered carbon cyclic structure such as a cyclopentane cyclic structure and a cyclohexane cyclic structure is preferable.

As preferred specific examples of the group shown by the formula (3), groups shown by the following formulas (3-1) to (3-5) can be given.

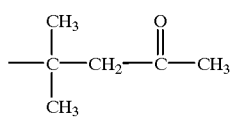

(1,1-dimethyl-3-oxobutyl group)

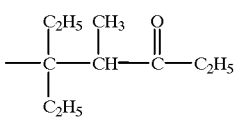

(1,1-diethyl-2-methyl-3-oxopentyl group)

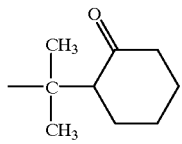

(1-(2'-oxocyclohexyl)-1-methylethyl group)

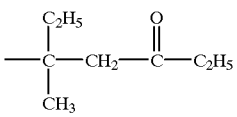

(1-methyl-2-ethyl-3-oxopentyl group)

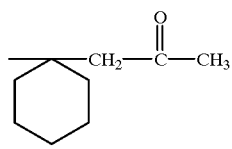

(1-(2-oxopropyl)cyclohexyl group)

The proportion of the recurring unit (2) to all the recurring units in the copolymer (a-1) is preferably 1–70 wt %, and still more preferably 5–50 wt %. If the proportion of the recurring unit (2) is less than 1 wt %, the dissolution rate of the irradiated area in an alkaline developer may decrease, making pattern formation difficult. If the proportion exceeds 70 wt %, resistance to dry etching tends to decrease due to the small amount of benzene rings in the copolymer.

The copolymer (a-2) may comprise both the recurring unit (4) having a hydrogen atom for $R^8$ and the recurring unit (4) having a methyl group for $R^8$ in the above formula (4) at the same time. Moreover, the copolymer (a-2) may comprise two or more recurring units (4) each of which has a different group for $R^9$ in the formula (4) at the same time.

In the formula (4), as specific examples of a tertiary alkyl group having 4–10 carbon atoms represented by $R^9$, a t-butyl group, 1,1-dimethylpropyl group, 1-methyl-1-ethylpropyl group, 1,1-diethylpropyl group, 1,1-dimethylbutyl group, 1-methyl-1-ethylbutyl group, 1,1-diethylbutyl group, 1,1-dimethylpentyl group, 1-methyl-1-ethylpentyl group, 1,1-diethylpentyl group, 1,1-dimethylhexyl group, l-methyl-1-ethylhexyl group, 1,1-diethylhexyl group, 1,1-dimethylheptyl group, 1-methyl-1-ethylheptyl group, 1,1-dimethyloctyl group, and the like can be given. Of these, a t-butyl group, 1,1-dimethylpropyl group, and the like are particularly preferable.

The proportion of the recurring unit (4) in the copolymers (a-2) to all the recurring units is preferably 1–70 wt %, and still more preferably 5–50 wt %. If the proportion of the recurring unit (4) is less than 1 wt %, resolution tends to decrease. If the proportion exceeds 70 wt %, sensitivity tends to decrease.

In addition to the above recurring units, the copolymers (a-l) and (a-2) may comprise at least one recurring unit produced by the cleavage of the polymerizable unsaturated bond of monomers selected from the group consisting of vinyl aromatic compounds, monofunctional (meth)acrylates, polyfunctional (meth)acrylates, and the like.

As specific examples of the vinyl aromatic compounds, styrene, α-methylstyrene, o-methylstyrene, m-methylstyrene, p-methylstyrene, p-chlorostyrene, and the like can be given.

As specific examples of the above monofunctional (meth)acrylates, methyl (meth) acrylate, ethyl (meth) acrylate, n-propyl (meth)acrylate, i-propyl (meth)acrylate, n-butyl (meth)acrylate, i-butyl (meth)acrylate, sec-butyl (meth) acrylate, t-butyl (meth)acrylate (only in the case of the copolymer (a-2)), cyclopentyl (meth)acrylate, cyclohexyl (meth)acrylate, benzyl (meth)acrylate, phenyl (meth) acrylate, tetracyclodecanyl (meth)acrylate, and the like can be given.

As specific examples of the above polyfunctional (meth)acrylates, ethylene glycol di (meth) acrylate, diethylene glycol di (meth) acrylate, triethylene glycol di (meth) acrylate, propylene glycol di(meth)acrylate, dipropylene glycol di(meth)acrylate, tripropylene glycol di(meth) acrylate, 2,5-dimethyl-2,5-hexanediol di(meth)acrylate, 2,6-dimethyl-4-oxo-2,6-heptanediol di(meth)acrylate, 2-ethyl-2-hydroxymethyl-1,3-propanediol tri(meth)acrylate, and the like can be given.

The proportion of the other recurring units to all the recurring units in the copolymers (a-1) and (a-2) is preferably 60 wt % or less, and still more preferably 30 wt % or less.

The copolymers (a-1) and (a-2) can be produced by polymerizing a mixture of monomers corresponding to each recurring unit by radical polymerization, anionic polymerization, heat polymerization, and the like.

The polystyrene-reduced weight average molecular weight determined by gel permeation chromatography (GPC) (hereinafter referred to as "Mw") of the copolymers (a-1) and (a-2) is preferably 1,500–500,000, and still more preferably 3,000–300,000 from the viewpoint of securing sensitivity, heat resistance, developability, and resolution.

The ratio of Mw of the copolymers (a-1) and (a-2) to the polystyrene-reduced number average molecular weight determined by GPC (hereinafter referred to as "Mn") (ratio hereinafter referred to as "Mw/Mn") is preferably 1–10, and still more preferably 1.0–5.0, in order to secure sensitivity, heat resistance, developability, and resolution.

The copolymer (a-1) can be used as a mixture of copolymers which comprise the recurring unit (1), recurring unit (2), or other recurring units in different proportions, or a mixture of copolymers each having a different Mw and/or Mw/Mn. In the case of using the copolymer (a-1) as such a mixture, it is preferable that the average proportion, average Mw, and average Mw/Mn of each recurring unit which constitutes the mixture be in the above ranges.

The copolymer (a-2) can be used as a mixture of copolymers which comprise the recurring unit (1), recurring unit (4), or other recurring units in different proportions, or a mixture of copolymers each having a different Mw and/or Mw/Mn. In the case of using the copolymer (a-2) as such a mixture, it is preferable that the average proportion, average Mw, and average Mw/Mn of each recurring unit which constitutes the mixture be in the above ranges.

Component (b)

The component (b) of the present invention is a photoacid generator (hereinafter referred to as "acid generator (b)") which generates acid upon irradiation (hereinafter referred to as "exposure").

As examples of the acid generator (b), (1) onium salt compounds, (2) sulfone compounds, (3) sulfonate compounds, (4) sulfonimide compounds, (5) diazomethane compounds, and the like can be given.

Examples of these compounds will be given below.

(1) Onium Salt Compounds:

As examples of onium salt compounds, iodonium salt, sulfonium salt, phosphonium salt, diazonium salt, ammonium salt, pyridinium salt, and the like can be given.

Specific examples of onium salt compounds include bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium 4-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 2,4-difluorobenzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium 4-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 2,4-difluorobenzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium 4-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 2,4-difluorobenzenesulfonate, triphenylsulfonium 10-camphorsulfonate, triphenylsulfonium n-octanesulfonate, 4-t-butylphenyl diphenylsulfonium perfluoro-n-butanesulfonate, 4-t-butylphenyl•diphenylsulfonium trifluoromethanesulfonate, 4-t-butylphenyl•diphenylsulfonium 2-trifluoromethylbenzenesulfonate, 4-t-butylphenyl•diphenylsulfonium 4-trifluoromethylbenzenesulfonate, 4-t-butylphenyl•diphenylsulfonium pyrenesulfonate, 4-t-butylphenyl•diphenylsulfonium n-dodec ylbenzenesulfonate, 4-t-butylphenyl•diphenylsulfonium p-toluenesulfonate, 4-t-butylphenyl•diphenylsulfonium benzenesulfonate, 4-t-butylphenyl•diphenylsulfonium 2,4-difluorobenzenesulfonate, 4-t-butylphenyl•diphenylsulfonium 10-camphorsulfonate, 4-t-butylphenyl•diphenylsulfonium n-octanesulfonate, and the like.

(2) Sulfone Compounds:

As examples of sulfone compounds, β-ketosulfone, β-sulfonylsulfone, and a-diazo compounds of these compounds, and the like can be given.

As specific examples of sulfone compounds, phenacylphenylsulfone, mesitylphenacylsulfone, bis (phenylsulfonyl)methane, 4-trisphenacylsulfone, and the like can be given.

(3) Sulfonate Compounds:

As examples of sulfonate compounds, alkyl sulfonate, haloalkyl sulfonate, aryl sulfonate, imino sulfonate, and the like can be given.

As specific examples of the sulfonate compounds, α-methylolbenzoin perfluoro-n-butanesulfonate, α-methylolbenzoin trifluoromethanesulfonate, α-methylolbenzoin 2-trifluoromethylbenzenesulfonate, phenacylphenylsulfone, mesitylphenacylsulfone, bis (phenylsulfonyl)methane, 4-trisphenacylsulfone, and the like can be given.

(4) Sulfonimide Compounds:

As examples of sulfonimide compounds, compounds shown by the following formula (6) and the like can be given:

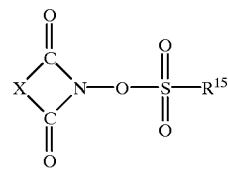

(6)

wherein X represents a divalent group such as an alkylene group, arylene group, and alkoxylene group, and $R^{15}$ represents a monovalent group such as an alkyl group, aryl group, halogen-substituted alkyl group, and halogen-substituted allyl group.

Specific examples of sulfonimide compounds include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3 -dicarboxyimide, N-(trifluoromethylsulfonyloxy)-7-oxabicyclo[2.2.1]hept-5-e ne-2,3-dicarboxyimide, N-(trifluoromethylsulfonyloxy)bicyclo[2.2.1]heptane-5, 6-ox y-2,3-dicarboxyimide, N-(trifluoromethylsulfonyloxy)naphthylimide, N-(camphorsulfonyloxy)succinimide, N-(camphorsulfonyloxy)phthalimide, N-(camphorsulfonyloxy)diphenylmaleimide, N-(camphorsulfonyloxy)bicyclo[2.2.1]hept-5-ene-2,3-dicarbo xyimide, N-(camphorsulfonyloxy)-7-oxabicyclo[2.2.1]hept-5-ene-2, 3-d icarboxyimide, N-(camphorsulfonyloxy)bicyclo[2.2.1]heptane-5,6-oxy-2, 3-di carboxyimide, N-(camphorsulfonyloxy) naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2, 3-dicarboxyimide, N-(4-methylphenylsulfonyloxy)-7-oxabicyclo[2.2.1]hept-5-en e-2,3-dicarboxyimide, N-(4-methylphenylsulfonyloxy)bicyclo[2.2.1]heptane-5,6-oxy -2,3-dicarboxyimide,
N-(4-methylphenylsulfonyloxy)naphthylimide,
N-(2-trifluoromethylphenylsulfonyloxy)succinimide,
N-(2-trifluoromethylphenylsulfonyloxy)phthalimide,
N-(2-trifluoromethylphenylsulfonyloxy) diphenylmaleimide,
N-(2-trifluoromethylphenylsulfonyloxy)bicyclo[2.2.1]hept-5 -ene-2,3-dicarboxyimido,
N-(2-trifluoromethylphenylsulfonyloxy)-7-oxabicyclo [2.2.1] hept-5-ene-2,3-dicarboxyimide,
N-(2-trifluoromethylphenylsulfonyloxy) bicyclo[2.2.1] heptane-5,6-oxy-2,3-dicarboxyimide,
N-(2-trifluoromethylphenylsulfonyloxy)naphthylimide,
N-(4-fluorophenylsulfonyloxy) succinimide,
N-(4-fluorophenylsulfonyloxy)phthalimide,
N-(4-fluorophenylsulfonyloxy)diphenylmaleimide,
N-(4-fluorophenylsulfonyloxy) bicyclo[2.2.1]hept-5-ene-23-dicarboxyimide,
N-(4-fluorophenylsulfonyloxy)-7-oxabicyclo[2.2.1]hept-5-en e-2,3-dicarboxyimide,
N-(4-fluorophenylsulfonyloxy)bicyclo[2.2.1]heptane-5,6-oxy -2,3-dicarboxyimide,
N-(4-fluorophenylsulfonyloxy)naphthylimide, and the like.
(5) Diazomethane Compounds:

As examples of diazomethane compounds, compounds shown by the following formula (7) and the like can be given:

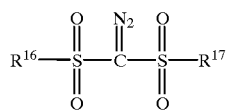

(7)

wherein $R^{16}$ and $R^{17}$ individually represent a monovalent group such as an alkyl group, aryl group, halogen-substituted alkyl group, and halogen-substituted allyl group.

As specific examples of diazomethane compounds, bis (trifluoromethylsulfonyl)diazomethane, bis (cyclohexylsulfonyl) diazomethane, bis(phenylsulfonyl) diazomethane, bis(p-toluenesulfonyl)diazomethane, methylsulfonyl p-toluenesulfonyldiazomethane, bis(1,1-dimethylethylsulfonyl)diazomethane, cyclohexylsulfonyl (1,1-dimethylethylsulfonyl)diazomethane, and the like can be given.

These acid generators (b) can be used individually or in combination of two or more.

Onium salt compounds and sulfonimide compounds are preferable as the acid generator (b). It is particularly preferable to use at least one compound selected from the group consisting of
bis(4-t-butylphenyl)iodonium perfluoro-n-butanesulfonate,
bis(4-t-butylphenyl)iodonium trifluoromethanesulfonate,
bis(4-t-butylphenyl)iodonium 2-trifluoromethylbenzenesulfonate,
bis(4-t-butylphenyl)iodonium 4-trifluoromethylbenzenesulfonate,
bis(4-t-butylphenyl)iodonium p-toluenesulfonate,
bis(4-t-butylphenyl)iodonium 2,4-difluorobenzenesulfonate,
bis(4-t-butylphenyl)iodonium 10-camphorsulfonate,
triphenylsulfonium perfluoro-n-butanesulfonate,
triphenylsulfonium trifluoromethanesulfonate,
triphenylsulfonium 2-trifluoromethylbenzenesulfonate,
triphenylsulfonium 4-trifluoromethylbenzenesulfonate,
triphenylsulfonium p-toluenesulfonate, triphenylsulfonium 2,4-difluorobenzenesulfonate, triphenylsulfonium 10-camphorsulfonate,
N-(trifluoromethylsulfonyloxy)succinimide,
N-(camphorsulfonyloxy)succinimide,
N-(trifluoromethylsulfonyloxy)bicyclo[2.2.1]hepto-5-ene-2,3-dicarboxyimide, and
N-(camphorsulfonyloxy)bicyclo[2.2.1]hepto-5-ene-2,3-dicarboxyimide.

The amount of the acid generator (b) to be used in the present invention is preferably 0.1–20 parts by weight, and still more preferably 0.5–15 parts by weight, for 100 parts by weight of the resin (a). If the amount of the acid generator (b) is less than 0.1 part by weight, sensitivity tends to decrease. If the amount exceeds 20 parts by weight, resist applicability tends to decrease.

Component (c)

The component (c) of the present invention is a compound shown by the above formula (5) (hereinafter referred to as "compound (c)").

When using a chemically-amplified radiation-sensitive resin composition which comprises a photoacid generator, it is known in the art that the pattern shape, preventive effect of eaves at the upper part of the pattern, and dimensional precision conforming to the mask dimensions can be further improved by the addition of a basic substance as an acid diffusion controller.

The present inventors have conducted extensive studies of the pattern shape, in particular, using the chemically-amplified radiation-sensitive resin composition which comprises the resin (a) as a resin component. As a result, the inventors have found that various performances of the radiation-sensitive resin composition are remarkably improved by using the compound (c) as an acid diffusion controller. This finding has led to the completion of the present invention.

In the formula (5), as $R^{10}$ $R^{11}$, $R^{12}$, and $R^{13}$ in the case where none of these form a heterocyclic structure, a linear or branched alkyl group having 1–16 carbon atoms such as a methyl group, ethyl group, n-propyl group, i-propyl group, n-butyl group, i-butyl group, sec-butyl group, t-butyl group, n-pentyl group, i-pentyl group, t-pentyl group, neopentyl group, 1-methylbutyl group, 2-methylbutyl group, 1,2-dimethylpropyl group, 1-ethylpropyl group, n-hexyl group, 1-methylpentyl group, n-heptyl group, n-octyl group, n-nonyl group, n-decyl group, n-undecyl group, n-dodecyl group, n-tridecyl group, n-tetradecyl group, n-pentadecyl group, or n-hexadecyl group;

a cycloalkyl group having 3–8 carbon atoms such as a cyclopropyl group, cyclobutyl group, cyclopentyl group, cyclohexyl group, 2-methylcyclohexyl group, 3-methylcyclohexyl group, 4-methylcyclohexyl group, cycloheptyl group, or cyclooctyl group;

a linear, branched, or cyclic alkenyl group having 2–8 carbon atoms such as a vinyl group, allyl group, methallyl group, or 3-cyclohexenyl group;

an aryl group having 6–10 carbon atoms such as a phenyl group, 2-methylphenyl group, 3-methylphenyl group, 4-methylphenyl group, 4-t-butylphenyl group, 1-naphthyl group, or 2-naphthyl group; and an aralkyl group having 7–12 carbon atoms such as a benzyl group, 2-methylbenzyl group, 3-methylbenzyl group, 4-methylbenzyl group, 4-t-butylbenzyl group, or phenethyl group are preferable. Of these, a linear or branched alkyl group having 1–16 carbon atoms, a cyclohexyl group, phenyl group, 4-t-butylphenyl group, benzyl group, or the like are particularly preferable.

As a heterocyclic structure formed by two of $R^{10}$, $R^{11}$, $R^{12}$, and $R^{13}$, a pentacyclic structure corresponding to pyrrolidine, 2-methylpyrrolidine, 3-methylpyrrolidine, 2-ethylpyrrolidine, 3-ethylpyrrolidine, 2,3-dimethylpyrrolidine, and the like;

a hexacyclic structure corresponding to piperidine, 2-methylpiperidine, 3-methylpiperidine, 4-methylpiperidine, 2-ethylpiperidine, 3-ethylpiperidine, 4-ethylpiperidine, 2,6-dimethylpiperidine, 3,5-dimethylpiperidine, 2,2,6,6-tetramethylpiperidine, and the like;

a heptacyclic structure corresponding to hexamethyleneimine, 2-methylhexamethyleneimine, 3-methylhexamethyleneimine, 4-methylhexamethyleneimine, and the like; and an octacyclic structure corresponding to heptamethyleneimine, 2-methylheptamethyleneimine, 3-methylheptamethyleneimine, 4-methylheptamethyleneimine, 5-methylheptamethyleneimine, and the like are preferable. Of these, a heterocyclic structure corresponding to pyrrolidine, 3-methylpyrrolidine, 3-ethylpyrrolidine, piperidine, 3-methylpiperidine, 4-methylpiperidine, 3-ethylpiperidine, 4-ethylpiperidine, 3,5-dimethylpiperidine, and the like are particularly preferable.

In the case where two of $R^{10}$, $R^{11}$, $R^{12}$, and $R^{13}$ form a heterocyclic structure, as the remaining two groups that do not form the heterocyclic structure among the above groups, a linear or branched alkyl group having 1–16 carbon atoms, cycloalkyl group having 3–8 carbon atoms, a linear, branched, or cyclic alkenyl group having 2–8 carbon atoms, an aryl group having 6–10 carbon atoms, an aralkyl group having 7–12 carbon atoms, and the like are preferable. Of these, a linear or branched alkyl group having 1–4 carbon atoms, a phenyl group, 4-t-butylphenyl group, benzyl group, and the like are particularly preferable.

In the formula (5), as a monovalent hydrocarbon group having 5–16 carbon atoms represented by $R^{14}$, a linear or branched alkyl group having 5–16 carbon atoms such as a n-pentyl group, i-pentyl group, t-pentyl group, neopentyl group, 1-methylbutyl group, 2-methylbutyl group, 1,2-dimethylpropyl group, 1-ethylpropyl group, n-hexyl group, 1-methylpentyl group, n-heptyl group, n-octyl group, n-nonyl group, n-decyl group, n-undecyl group, and n-dodecyl group;

a cycloalkyl group having 5–12 carbon atoms such as a cyclopentyl group, cyclohexyl group, cycloheptyl group, and cyclooctyl group;

a cycloalkylmethyl group having 5–12 carbon atoms such as a cyclobutylmethyl group, cyclopentylmethyl group, cyclohexylmethyl group, cycloheptylmethyl group, and cyclooctylmethyl group;

other alicyclic groups having 5–12 carbon atoms such as a 1-adamantyl group and 1-adamantylmethyl group;

an (alkyl-substituted) phenyl group having 6–12 carbon atoms such as a phenyl group, 2-methylphenyl group, 3-methylphenyl group, 4-methylphenyl group, 2-ethylphenyl group, 3-ethylphenyl group, 4-ethylphenyl group, 4-t-butylphenyl group, 2,3-dimethylphenyl group, 2,4-dimethylphenyl group, 2,5-dimethylphenyl group, 2,6-dimethylphenyl group, 3,4-dimethylphenyl group, and 3,5-dimethylphenyl group;

an (alkyl-substituted) naphthyl group having 10–12 carbon atoms such as a 1-naphthyl group, 2-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 1-methyl-2-naphthyl group, 3-methyl-2-naphthyl group, 4-methyl-2-naphthyl group, 5-methyl-2-naphthyl group, 6-methyl-2-naphthyl group, 7-methyl-2-naphthyl group, and 8-methyl-2-naphthyl group; and an (alkyl-substituted) aralkyl group having 7–12 carbon atoms such as a benzyl group, 2-methylphenylmethyl group, 3-methylphenylmethyl group, 4-methylphenylmethyl group, 2-ethylphenylmethyl group, 3-ethylphenylmethyl group, 4-ethylphenylmethyl group, 2,3-dimethylphenylmethyl group, 4-dimethylphenylmethyl group, 2,5-dimethylphenylmethyl group, 2,4-dimethylphenylmethyl group, 3,4-dimethylphenylmethyl group, 3,5-dimethylphenylmethyl group, phenethyl group, 2-(2-imethylphenyl) ethyl group, 2-(3-methylphenyl) ethyl group, 2-(4-methylphenyl) ethyl group, 2-(2-ethylphenyl) ethyl group, 2-(3-ethylphenyl) ethyl group, 2-(4-ethylphenyl) ethyl group, 2-(2,3-dimethylphenyl)ethyl group, 2-(2,4-dimethylphenyl)ethyl group, 2-(2,5-dimethylphenyl)ethyl group, 2-(2,6-dimethylphenyl)ethyl group, 2-(3,4-dimethylphenyl)ethyl group, and 2-(3,5-dimethylphenyl)ethyl group are preferable. Of these, a linear or branched alkyl group having 5–12 carbon atoms, a cyclopropyl group, cyclobutyl group, cyclopentyl group, cyclohexyl group, 1-adamantyl group, 1-adamantylmethyl group, phenyl group, benzyl group, and the like are particularly preferable.

As an acyl group having 2–16 carbon atoms represented by $R^{14}$, an aliphatic acyl group having 2–10 carbon atoms such as an acetyl group, propionyl group, butyryl group, and valeryl group; an aromatic acyl group having 7–11 carbon atoms such as a benzoyl group, o-toluoyl group, m-toluoyl group, and p-toluoyl group; and the like are preferable. Of these, an acetyl group, propionyl group, benzoyl group, and the like are particularly preferable.

As a group $R^{14}$ in which a monovalent hydrocarbon group having 1–16 carbon atoms is replaced by a carboxyl group, a linear or branched alkyl group replaced by a carboxyl group (number of carbon atoms in total: 2–10) such as a carboxymethyl group, 1-carboxyethyl group, 2-carboxyethyl group, 1-carboxypropyl group, 2-carboxypropyl group, 3-carboxypropyl group, 4-carboxybutyl group, and 2-methyl-3-carboxypropyl group;

an alicyclic group replaced by a carboxyl group (number of carbon atoms in total: 4–14) such as a 4-carboxycyclohexyl group, 4-carboxycyclohexylmethyl group, 4-carboxy-1-adamantyl group, and (4-carboxy-1-adamantyl)methyl group;

an (alkyl-substituted) aryl group replaced by a carboxyl group (number of carbon atoms in total: 7–11) such as 2-carboxyphenyl group, 3-carboxyphenyl group, 4-methyl-3-carboxyphenyl group, 4-carboxyphenyl group, and 3-methyl-4-carboxyphenyl group; and an (alkyl-substituted) aralkyl group replaced by a carboxyl group (number of carbon atoms in total: 8–12) such as a 4-carboxybenzyl group, 3-methyl-4-carboxybenzyl group, 2-(4-carboxyphenyl)ethyl group, and -10 2-(3-methyl-4-carboxyphenyl)ethyl group are preferable. Of these, a carboxymethyl group, 1-carboxyethyl group, 2-carboxyethyl group, 1-carboxypropyl group, 2-carboxypropyl group, 3-carboxypropyl group, 2-carboxyphenyl group, and the like are particularly preferable.

As specific examples of the cationic moiety ($R^{10}.R^{11}.R^{12}.R^{13}N^+$) of the particularly preferred compound (c) of the present invention, tetramethylammonium, tetraethylammonium, tetra-n-propylammonium, tetra-n-butylammonium, tetra-n-pentylammonium, tetra-n-hexylammonium, tetra-n-octylammonium, tetra-n-decylammonium, tetra-n-dodecylammonium, n-hexyl-trimethylammonium, n-octyl-trimethylammonium, n-nonyl-trimethylammonium, n-decyl-trimethylammonium, n-dodecyl-trimethylammonium,
n-tetradecyl·trimethylammonium,
n-hexadecyl·trimethylammonium,
cyclohexyl·trimethylammonium, allyl·trimethylammonium,
phenyl·trimethylammonium, 4-t-butylphenyl·trimethylammonium,
benzyl·trimethylammonium, methyl·triethylammonium,
cyclohexyl-triethylammonium, phenyl·triethylammonium,
4-t-butylphenyl·triethylammonium,
benzyl·triethylammonium, benzyl·tri-n-propylammonium,
benzyl·tri-n-butylammonium, methyl·tri-n-octylammonium, and the like can be given.

As specific examples of the anionic moiety ($R^{14}COO^-$) of the particularly preferred compound (c) of the present invention, hexanoate, heptanoate, octanoate, decanoate, dodecanoate, cyclopentanecarboxylate, cyclohexanecarboxylate, 1-adamantanecarboxylate, 2-(1-adamantyl) acetate, pyruvate, 2-ketobutyrate, oxalate, malonate, succinate, phthalate, and the like can be given.

In the present invention, combinations of the cationic moiety and anionic moiety of the above particularly preferred compound (c) can be optionally selected.

The compound (c) of the present invention can be used either individually or in combination of two or more.

The amount of the compound (c) to be used in the present invention is preferably 0.01–10 parts by weight, and still more preferably 0.01–3 parts by weight, for 100 parts by weight of the resin (a).

According to the present invention, a rectangular resist pattern exhibiting high sensitivity can be obtained by using the compound (c) in the above amount, even in the case of performing microprocessing of design dimensions of about 0.20 μm with a thin film.

Dissolution Controller

The dissolution controller described below can be optionally added to the radiation-sensitive resin composition of the present invention.

The dissolution controller controls alkali-solubility of the radiation-sensitive resin composition. The dissolution controller is a compound which reduces or eliminates the effect of controlling the alkali solubility of the radiation-sensitive resin composition or promotes the alkali solubility of the radiation-sensitive resin composition by causing decomposition, for example, hydrolysis in the presence of acid.

As examples of such a dissolution controller, compounds in which a hydrogen atom of the acidic functional group such as a phenolic hydroxyl group and a carboxyl group is replaced by an acid-decomposable group can be given.

Both low-molecular compounds and macromolecular compounds can be used as the dissolution controller. As examples of preferred dissolution controller, polyhydric phenol compounds such as bisphenol A, bisphenol F, bisphenol S, 1,1-bis(4-hydroxyphenyl)-1-[4-{1-methyl-1-(4-hydroxyphenyl )ethyl}phenyl]ethane, compounds in which a hydrogen atom of an acidic functional group of a carboxylic acid compound is replaced by an acid-decomposable group such as 4-hydroxyphenylacetic acid, and the like can be given.

As specific examples of preferred low-molecular compounds used as the dissolution controller, compounds shown by the following structural formulas (8) and (9) can be given.

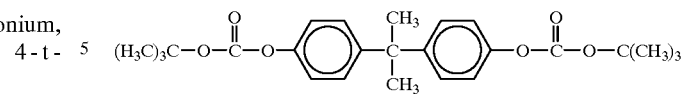

(8)

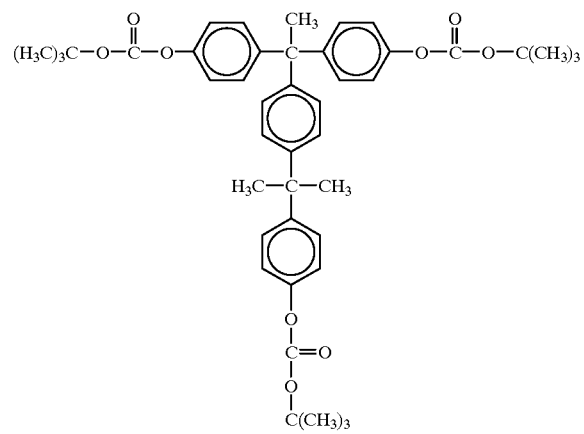

(9)

As the macromolecular dissolution controller, resins containing an acid-decomposable group other than the resin (a) (hereinafter referred to as "dissolution controllable resin") can be used.

The acid-decomposable group is defined as a substituent which decomposes in the presence of acid to provide alkali-solubility to the dissolution controller.

As examples of such an acid-decomposable group, a substituted methyl group, 1-substituted ethyl group, 1-branched alkyl group, silyl group, germyl group, alkoxycarbonyl group, acyl group, cyclic acid-decomposable group, and the like can be given.

As examples of the above substituted methyl group, a methoxymethyl group, methylthiomethyl group, ethoxymethyl group, ethylthiomethyl group, 2-methoxyethoxymethyl group, benzyloxymethyl group, benzylthiomethyl group, cyclopropylmethyl group, benzyl group, 4-bromobenzyl group, 4-nitrobenzyl group, 4-methoxybenzyl group, 4-methylthiobenzyl group, 4-ethoxybenzyl group, 4-ethylthiobenzyl group, diphenylmethyl group, triphenylmethyl group, piperonyl group, and the like can be given.

As examples of the above 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, α-methylphenacyl group, and the like can be given.

As examples of the above 1-branched alkyl group, a i-propyl group, sec-butyl group, t-butyl group (excluding the case of the dissolution controllable resin), 1,1-dimethylpropyl group, 1-methylbutyl group, 1,1-dimethylbutyl group, and the like can be given.

As examples of the above silyl group, a trimethylsilyl group, dimethyl·ethylsilyl group, methyl·diethylsilyl group, triethylsilyl group, dimethyl·i-propylsilyl group, methyl·di-i-propylsilyl group, tri-i-propylsilyl group, dimethyl·t-butylsilyl group, methyl·di-t-butylsilyl group, tri-t-butylsilyl group, dimethyl·phenylsilyl group, methyl·diphenylsilyl group, triphenylsilyl group, and the like can be given.

As examples of the above germyl group, a trimethylgermyl group, dimethyl·ethylgermyl group, methyl·diethylgermyl group, triethylgermyl group, dimethyl·i-propylgermyl group, methyl·di-i-propylgermyl group, tri-i-propylgermyl group, dimethyl·t-butylgermyl group, methyl·di-t-butylgermyl group, tri-t-butylgermyl group, dimethyl·phenylgermyl group, methyl·diphenylgermyl group, triphenylgermyl group, and the like can be given.

As examples of the above alkoxycarbonyl group, a methoxycarbonyl group, ethoxycarbonyl group, i-propoxycarbonyl group, t-butoxycarbonyl group, t-pentyloxycarbonyl group, and the like can be given.

As examples of the above acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group, glutaryl group, adipoyl group, piperoylgroup, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the above cyclic acid-decomposable group, a cyclopropyl group, cyclopentyl group, cyclohexyl group, cyclohexenyl group, oxocyclohexenyl group, 4-methoxycyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 4-methoxytetrahydrothiopyranyl group, S,S-dioxide group, 2-1,3-dioxolanyl group, 2-1,3-dithiolanyl group, benzo-2-1,3-dioxolanyl group, benzo-2-1,3-dithiolanyl group, and the like can be given.

Of these acid-decomposable groups, a benzyl group, t-butyl group, t-butoxycarbonyl group, tetrahydropyranyl group, tetrahydrofuranyl group, tetrahydrothiopyranyl group, tetrahydrothiofuranyl group, and the like are preferable.

The dissolution controllable resin is prepared by a method of introducing at least one acid-decomposable group to an alkali-soluble resin having an acidic functional group, a method of (co)polymerizing monomers having at least one acid-decomposable group, a method of (co)condensing polycondensation components having at least one acid-decomposable group, and the like.

The introduction ratio of the acid-decomposable group to the dissolution controllable resin (ratio of the number of acid-decomposable groups to the total number of acidic functional groups and acid-decomposable groups in the dissolution controllable resin) is preferably 15–100%, still more preferably 20–100%, and particularly preferably 20–80%.

Mw of the dissolution controllable resin is preferably 1,000–150,000, and still more preferably 3,000–100,000.

In the present invention, the low-molecular compound and the macromolecular compound (dissolution controllable resin) can be used as a dissolution controller individually or in combination of two or more. The low-molecular compound and macromolecular compound may be used in combination.

The amount of the dissolution controller to be used in the present invention is preferably 100 parts by weight or less for 100 parts by weight of the resin (a). If the amount of the dissolution controller exceeds 100 parts by weight, film formability, film hardness, and the like of the resin composition tend to decrease.

Other Additives

Other additives such as surfactants and sensitizers can be optionally added to the radiation-sensitive resin composition of the present invention.

Surfactants improve applicability and striation of the radiation-sensitive resin composition and developability of the resist.

As examples of surfactants, polyoxyethylene lauryl ether, polyoxyethylene stearyl ether, polyoxyethylene oleyl ether, polyoxyethylene n-octyl phenyl ether, polyoxyethylene n-nonyl phenyl ether, polyoxyethylene glycol dilaurate, polyoxyethylene glycol distearate; and commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F172, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.), and the like can be given.

These surfactants can be used either individually or in combination of two or more.

The amount of surfactant to be added is 2 parts by weight or less for 100 parts by weight of the total solid content of the radiation-sensitive resin composition.

Sensitizers absorb the energy of radiation and transmit this energy to the acid generator (b), thereby increasing the amount of acid to be generated upon exposure. As a result, sensitizers improve the apparent sensitivity of the resist produced from the radiation-sensitive resin composition of the present invention.

As specific examples of preferable photosensitizers, acetone, benzene, acetophenones, benzophenones, naphthalenes, biacetyl, Eosine, Rose Bengale, pyrenes, anthracenes, phenothiazines, and the like can be given.

These sensitizers can be used either individually or in combination of two or more.

The amount of sensitizer to be added is 50 parts by weight or less, and preferably 30 parts by weight or less, for 100 parts by weight of the total solid content of the radiation-sensitive resin composition.

The addition of dyes or pigments relaxes the effect of halation at the time of exposure. Use of adhesion improvers improves adhesion to substrates.

As other additives, halation inhibitors such as azo compounds, preservation stabilizers, antifoaming agents, form improvers, and the like can be given.

Solvent

The radiation-sensitive resin composition of the present invention is prepared as a composition solution by dissolving the composition in a solvent so that the solid content is 0.5–50 wt %, and preferably 0.5–40 wt %, and filtering the composition using a filter with a pore diameter of about 0.2 μm.

As examples of a solvent used for preparing the above composition solution, ethylene glycol monoalkyl ethers such as ethylene glycol monomethyl ether, ethylene glycol monoethyl ether, ethylene glycol mono-n-propyl ether, and ethylene glycol mono-n-butyl ether;

ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

diethylene glycol dialkyl ethers such as diethylene glycol dimethyl ether, diethylene glycol diethyl ether, diethylene glycol di-n-propyl ether, diethylene glycol di-n-butyl ether;

propylene glycol monoalkyl ethers such as propylene glycol monomethyl ether, propylene glycol monoethyl ether, propylene glycol mono-n-propyl ether, and propylene glycol mono-n-butyl ether;

propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

propylene glycol dialkyl ethers such as propylene glycol dimethyl ether, propylene glycol diethyl ether, propylene glycol di-n-propyl ether, and propylene glycol di-n-butyl ether;

lactic acid esters such as methyl lactate, ethyl lactate, n-propyl lactate, i-propyl lactate, n-butyl lactate, and i-butyl lactate;

aliphatic carboxylic acid esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate;

other esters such as ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, butyl 3-methoxyacetate, butyl 3-methyl-3-methoxyacetate, butyl 3-methyl-3-methoxypropionate, butyl 3-methyl-3-methoxybutyrate, methyl acetoacetate, ethyl acetoacetate, methyl pyruvate, and ethyl pyruvate;

aromatic hydrocarbons such as toluene and xylene;

ketones such as methyl ethyl ketone, 2-heptanone, 3-heptanone, 4-heptanone, and cyclohexanone;

amides such as N-methylformamide, N,N-dimethylformamide, N-methylacetamide, N,N-dimethylacetamide, and N-methylpyrrolidone; and lactones such as y-butyrolactone can be given.

These solvents can be used either individually or in combination of two or more.

The amount of solvent used to prepare the composition solution is 100–20,000 parts by weight, preferably 150–15,000 parts by weight, and still more preferably 200–10,000 parts by weight, for 100 parts by weight of the total solid content of the radiation-sensitive resin composition.

Formation of Resist Pattern

When forming a resist pattern from the radiation-sensitive resin composition of the present invention, the composition solution is applied to a substrate, such as a silicon wafer or a wafer coated with aluminum, by rotational coating, cast coating, roll coating, and the like. The applied composition solution is pre-baked to form a resist film. The resist film is then exposed to form a desired pattern. In this case, the effect of the present invention is significant by forming the resist film as thin as, for example, 0.6 $\mu$m or less.

Radiation used for exposure is appropriately selected from ultraviolet radiation such as i-rays, deep ultraviolet radiation such as an excimer laser, X-rays such as synchrotron radiation, charged particle rays such as electron beams, and the like. Of these, deep ultraviolet radiation, X-rays, and charged particle rays are particularly preferable. The exposure conditions such as the dose of radiation are appropriately determined according to the composition of the radiation-sensitive resin composition, types of additives, and the like.

When forming the resist pattern using the radiation-sensitive resin composition of the present invention, a protective film may be provided on the resist film in order to prevent the effect of basic impurities and the like included in an working atmosphere.

In the present invention, it is preferable to post-bake after exposure in order to improve the apparent sensitivity of the resist film. The heating temperature is usually 50–200° C., and preferably 80–160° C., although the heating conditions vary according to the composition of the radiation-sensitive resin composition, types of additives, and the like.

The resist film is then developed using an alkaline developer to form a predetermined resist pattern.

As the above alkaline developer, an aqueous solution prepared by dissolving alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethyl ammoniumhydroxide, tetraethyl ammoniumhydroxide, choline, pyrrole, piperidine, 1,8-diazabicyclo[5.4.0]-7-undecene, and 1,5-diazabicyclo[4.3.0]-5-nonene to a concentration of 1–10 wt %, and preferably 2–5 wt % is used.

Moreover, an appropriate amount of a water-soluble organic solvent such as methanol and ethanol or surfactants can be added to the developer.

After using a developer consisting of the above alkaline aqueous solution, the resist film is generally washed with water after development.

EXAMPLES

The present invention will be described in more detail by way of examples and comparative examples. However, these examples should not be construed as limiting the present invention.

Measurements and evaluations in Examples and Comparative Examples were carried out as follows.

Mw and Mw/Mn

Mw and Mw/Mn were measured by gel permeation chromatography (GPC) with monodispersed polystyrene as a standard reference material using a GPC column (manufactured by Tosoh Corp., G2000HXL X 2, G3000HXL X 1, G4000HXL X 1) under the following analysis conditions.

Flow rate: 1.0 ml/minute

Eluate: tetrahydrofuran

Column temperature: 40° C.

Optimum dose

When forming a resist pattern on various substrates by developing the pattern using a tetramethyl ammonium hydroxide aqueous solution (2.38 wt %), washing with water, and drying, the dose at which a one-to-one line and space pattern (1L1S) with a line width of 0.20 $\mu$m was formed was taken as the optimum dose.

Resolution

Minimum dimensions ($\mu$m) of the resist pattern resolved at the optimum dose were taken as the resolution of the resist film.

Pattern Shape

The width La of the upper flat surface of the rectangular 1L1S cross-section with a line width of 0.20 $\mu$m formed on the substrate and the line width Lb at the middle of the pattern were measured using a scanning electron microscope. A resist pattern satisfying the formula "Lb X 0.90<= La<=Lb X 1.1" of which the wall is almost vertical was judged as having a "good" shape. A resist pattern which did not satisfy at least one of the above conditions was judged as having a "bad" shape.

Synthesis Example 1

30 g of p-hydroxystyrene, 10 g of t-butyl acrylate, and 8 g of styrene were dissolved in 50 g of dioxane. After the addition of 8.2 g of 2,2'-azobisisobutyronitrile, nitrogen gas was bubbled through the mixture for 30 minutes. The mixture was then polymerized for 7 hours at 60° C. while bubbling nitrogen gas. After polymerization, the reaction solution was poured into a large quantity of hexane, causing the polymer to coagulate. The polymer was then recovered. This polymer was dissolved in acetone and was again caused to coagulate in hexane. This operation was repeated several times to remove the unreacted monomers. The polymer was dried overnight at 50° C. under reduced pressure to obtain a white polymer (yield: 55 wt %).

As a result of $^1$H-NMR analysis, the copolymerization ratio (weight ratio) of p-hydroxystyrene, t-butyl acrylate, and styrene of this polymer was approximately 3:1:1, and Mw and Mw/Mn were respectively 24,000 and 2.0.

This polymer is referred to as a "resin (a-1)".

Synthesis Example 2

A white polymer (yield: 57 wt %) was obtained in the same manner as in Synthesis Example 1, except for using 30 g of p-hydroxystyrene and 20 g of t-butyl acrylate as monomers.

As a result of $^1$H-NMR analysis, the copolymerization ratio (weight ratio) of p-hydroxystyrene and t-butyl acrylate of this polymer was approximately 3:2, and Mw and Mw/Mn were respectively 22,000 and 2.4.

This polymer is referred to as a "resin (a-2)".

Synthesis Example 3

A white polymer (yield: 48 wt %) was obtained in the same manner as in Synthesis Example 1, except for using 30 g of p-hydroxystyrene, 10 g of t-butyl acrylate, 8 g of styrene, and 4 g of tripropylene glycol diacrylate as monomers.

As a result of H-NMR analysis, the copolymerization ratio (weight ratio) of p-hydroxystyrene, t-butyl acrylate, styrene, and tripropylene glycol diacrylate of this polymer was approximately 3:1:1:0.1, and Mw and Mw/Mn were respectively 53,000 and 3.6.

This polymer is referred to as a "resin (a-3)".

Synthesis Example 4

35 g of p-hydroxystyrene, 15 g of p-t-butoxystyrene, and 5 g of t-butyl acrylate were dissolved in 55 g of dioxane. After the addition of 10 g of 2,2'-azobisisobutyronitrile, nitrogen gas was bubbled through the mixture for 30 minutes. The mixture was then polymerized for 7 hours at 60° C. while bubbling nitrogen gas. After polymerization, the reaction solution was poured into a large quantity of hexane, causing the polymer to coagulate. The polymer was then recovered. This polymer was dissolved in acetone and was again caused to coagulate in hexane. This operation was repeated several times to remove the unreacted monomers. The polymer was dried overnight at 50° C. under reduced pressure to obtain a white polymer (yield: 53 wt %).

As a result of $^1$H-NMR analysis, the copolymerization ratio (weight ratio) of p-hydroxystyrene, p-t-butoxystyrene, and t-butyl acrylate of this polymer was approximately 7:3:1, and Mw and Mw/Mn were respectively 12,000 and 1.7.

This polymer is referred to as a "resin (a-4)".

Synthesis Example 5

A white polymer (yield: 50 wt %) was obtained in the same manner as in Synthesis Example 4, except for using 30 g of p-hydroxystyrene and 20 g of p-t-butoxystyrene as monomers.

As a result of $^1$H-NMR analysis, the copolymerization ratio (weight ratio) of p-hydroxystyrene and p-t-butoxystyrene of this polymer was approximately 3:2, and Mw and Mw/Mn were respectively 13,000 and 1.7.

This polymer is referred to as a "resin (a-5)".

Synthesis Example 6

A white polymer (yield: 53 wt %) was obtained in the same manner as in Synthesis Example 4, except for using 32 g of p-hydroxystyrene, 14 g of p-t-butoxystyrene, and 4 g of styrene as monomers.

As a result of $^1$H-NMR analysis, the copolymerization ratio (weight ratio) of p-hydroxystyrene, p-t-butoxystyrene, and styrene of this polymer was approximately 16:7:2, and Mw and Mw/Mn were respectively 12,000 and 1.8.

This polymer is referred to as a "resin (a-6)".

Examples 1–13 and Comparative Examples 1–3

The resin (a), acid generator (b), compound (c), dissolution controller, and solvent were mixed according to the blending ratios shown in Table 1 (Examples 1–13) or Table 2 (Comparative Examples 1–3) (part(s) means part(s) by weight) to prepare a homogeneous solution. The solution was filtered using a membrane filter with a pore diameter of 0.2 μm to prepare a composition solution.

Each composition solution was then applied to a silicon wafer using a spin coater and was pre-baked for 100 seconds at 130° C. to form a resist film with a thickness of 0.5 μm. The resist film was exposed using the radiation shown in Table 3 (Examples 1–13) or Table 4 (Comparative Examples 1–3). As a KrF excimer laser exposure device, Nikon NS R2205EX 12B (numerical aperture: 0.55, manufactured by Nikon Corp.) was used. In the case of electron beams, a Hitachi HL700D (acceleration voltage was remodeled to 50 KeV, manufactured by Hitachi, Ltd.) was used as an electron beam drawing device. The exposed resist film was post-baked for 120 seconds at 130° C. and was then developed by a immersion method for 1 minute at 23° C., followed by washing with water for 30 seconds.

The evaluation results for each resist are shown in Tables 3 and 4.

TABLE 1

|  | Resin (a) (part(s)) | Acid generator (b) (part(s)) | Compound (c) (part(s)) | Dissolution controller (part(s)) | Solvent (part(s)) |
| --- | --- | --- | --- | --- | --- |
| Example 1 | a-1 (100) | b-1 (2)<br>b-2 (2) | c-1 (0.50) | — | EL (400)<br>EEP (200) |
| Example 2 | a-2 (100) | b-1 (2) | c-2 (0.14) | — | EL (400)<br>PGMEA (200) |

TABLE 1-continued

| | Resin (a) (part(s)) | Acid generator (b) (part(s)) | Compound (c) (part(s)) | Dissolution controller (part(s)) | Solvent (part(s)) |
|---|---|---|---|---|---|
| Example 3 | a-3 (100) | b-3 (4) b-4 (4) | c-3 (0.70) | — | PGMEA (400) EL (200) |
| Example 4 | a-4 (100) | b-1 (5) | c-4 (0.90) | A-1 (20) | EL (200) |
| Example 5 | a-5 (100) | b-2 (2) b-3 (1) | c-1 (0.19) c-6 (0.17) | — | MAK (600) |
| Example 6 | a-6 (100) | b-3 (4) | c-5 (0.70) | — | PDMEA (600) |
| Example 7 | a-1 (20) a-5 (80) | b-2 (5) b-4 (2) | c-6 (0.70) | — | MMP (600) |
| Example 8 | a-3 (90) a-5 (10) | b-3 (6) | c-3 (0.35) c-4 (0.60) | — | EL (100) EEP (500) |
| Example 9 | a-2 (10) a-6 (90) | b-2 (4) b-4 (4) | c-6 (0.35) c-7 (0.41) | — | EL (100) EEP (500) |
| Example 10 | a-1 (100) | b-1 (2) b-4 (6) | c-3 (0.25) c-6 (0.25) | A-1 (50) | EL (400) MAK (200) |
| Example 11 | a-5 (100) | b-2 (3) | c-7 (0.42) | — | EL (200) PGMEA (400) |
| Example 12 | a-1 (100) | b-5 (2) | c-2 (0.30) | — | EL (400) PGMEA (200) |
| Example 13 | a-4 (100) | b-2 (1) b-5 (1) | c-1 (0.50) | — | EL (400) EEP (200) |

TABLE 2

| | Resin (a) (part(s)) | Acid generator (b) (part(s)) | Compound (c) (part(s)) | Dissolution controller (part(s)) | Solvent (part(s)) |
|---|---|---|---|---|---|
| Comparative Example 1 | a-1 (100) | b-1 (5) | — | A-1 (25) | EL (600) |
| Comparative Example 2 | a-5 (100) | b-2 (2) | — | — | PGMEA (600) |
| Comparative Example 3 | a-2 (100) | b-3 (3) b-4 (5) | — | — | MAK (600) |

Each component, other than the resins (a-1) to (a-6) shown in Tables 1 and 2, is as follows.

Acid Generator (b)
b-1: Bis(4-t-butylphenyl)iodonium perfluoro-n-butanesulfonate
b-2: Bis(4-t-butylphenyl)iodonium 10-camphorsulfonate
b-3: Triphenylsulfonium perfluoro-n-butanesulfonate
b-4: N-(trifluoromethylsulfonyloxy)bicyclo[2.2.1]hepto-5-ene-2,3-dicarboxyimide
b-5: Bis(4-t-butylphenyl)iodonium 2,4-difluorobenzenesulfonate Compound (c)
c-1: Tetramethylammonium adamantanecarboxylate
c-2: Tetramethylammonium oxalate
c-3: Tetraethylammonium pyruvate
c-4: 4-t-butylphenyl•triethylammonium adamantanecarboxylate
c-5: Benzyl•trimethylammonium adamantanecarboxylate
c-6: Benzyl•trimethylammonium oxalate
c-7: Benzyl•triethylammonium pyruvate Dissolution Controller
A-1: A compound shown by the above structural formula (8)

Solvent
EL: Ethyl lactate
EEP: Ethyl 3-etoxypropionate
MMP: Methyl 3-metoxypropionate
PGMEA: Propylene glycol monomethyl ether acetate
MAK: 2-Heptanone

TABLE 3

| | Radiation | Optimum dose | Resolution | Pattern shape |
|---|---|---|---|---|
| Example 1 | KrF excimer laser | 33 mJ/cm$^2$ | 0.18 μm | Good |
| Example 2 | KrF excimer laser | 29 mJ/cm$^2$ | 0.18 μm | Good |
| Example 3 | KrF excimer laser | 30 mJ/cm$^2$ | 0.18 μm | Good |
| Example 4 | KrF excimer laser | 32 mJ/cm$^2$ | 0.18 μm | Good |
| Example 5 | KrF excimer laser | 28 mJ/cm$^2$ | 0.18 μm | Good |
| Example 6 | KrF excimer laser | 30 mJ/cm$^2$ | 0.18 μm | Good |
| Example 7 | KrF excimer laser | 31 mJ/cm$^2$ | 0.18 μm | Good |
| Example 8 | KrF excimer laser | 32 mJ/cm$^2$ | 0.18 μm | Good |
| Example 9 | KrF excimer laser | 29 mJ/cm$^2$ | 0.18 μm | Good |
| Example 10 | KrF excimer laser | 28 mJ/cm$^2$ | 0.18 μm | Good |
| Example 11 | Electron beams* | 8 μC/cm$^2$ | 0.18 μm | Good |

TABLE 3-continued

|  | Radiation | Optimum dose | Resolution | Pattern shape |
|---|---|---|---|---|
| Example 12 | KrF excimer laser | 30 mJ/cm² | 0.18 μm | Good |
| Example 13 | KrF excimer laser | 30 mJ/cm² | 0.18 μm | Good |

*Beam diameter: 0.25 μm

TABLE 4

|  | Radiation | Optimum dose | Resolution | Pattern shape |
|---|---|---|---|---|
| Comparative Example 1 | KrF excimer laser | 27 mJ/cm² | 0.20 μm | Bad (top edge rounded) |
| Comparative Example 2 | KrF excimer laser | 33 mJ/cm² | 0.20 μm | Bad (top edge rounded) |
| Comparative Example 3 | KrF excimer laser | 28 mJ/cm² | 0.20 μm | Bad (top edge rounded) |

The radiation-sensitive resin composition of the present invention is capable of producing a high-precision resist pattern while preventing the top edge of the pattern from rounding, which is a big problem in microprocessing of design dimensions of about 0.20 μm with a thin film of, for example, 0.6 μm or less.

Moreover, when forming a minute pattern using various types of radiation, the radiation-sensitive resin composition of the present invention can form a rectangular pattern exhibiting no narrow or overhanging part at the top of the pattern.

Furthermore, the radiation-sensitive resin composition of the present invention is highly sensitive to deep ultraviolet radiation, X-rays, and charged particle rays and exhibits excellent sensitivity, resolution, and the like.

Therefore, the radiation-sensitive resin composition of the present invention can be extremely suitable as a resist used for manufacturing semiconductor devices, which will tend to become more and more minute.

What is claimed is:

1. A radiation-sensitive resin composition comprising:
   (a) the following copolymer (a-1) or copolymer (a-2), or a mixture of the copolymer (a-1) and copolymer (a-2):
   copolymer (a-1): a copolymer (I) which comprises a recurring unit shown by the following formula (1) and a recurring unit shown by the following formula (2),

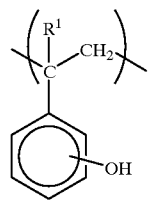
(1)

wherein $R^1$ represents a hydrogen atom or a methyl group,

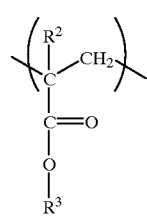
(2)

wherein $R^2$ represents a hydrogen atom or a methyl group, and $R^3$ represents a t-butyl group or a group shown by the following formula (3),

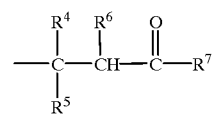
(3)

wherein $R^4$ and $R^5$ individually represent a hydrogen atom, a linear or branched alkyl group having 1–6 carbon atoms, or a 5–8 membered cyclic alkyl group; or $R^4$ and $R^5$ forma 5–8 membered carbon cyclic structure in combination together with the carbon atom of the formula (3), and $R^6$ and $R^7$ individually represent a hydrogen atom, a linear or branched alkyl group having 1–6 carbon atoms, or a 5–8 membered cyclic alkyl group, or $R^6$ and $R^7$ form a 5–8 membered carbon cyclic structure in combination with the carbon atom of the formula (3);

copolymer (a-2): a copolymer (II) which comprises a recurring unit shown by the above formula (1) and a recurring unit shown by the following formula (4),

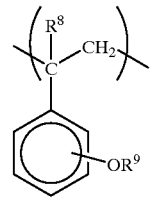
(4)

wherein $R^8$ represents a hydrogen atom or a methyl group, and $R^9$ represents a tertiary alkyl group having 4–10 carbon atoms;

(b) a photoacid generator; and
   (c) a compound shown by the following formula (5),

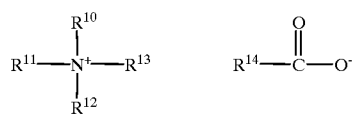
(5)

wherein $R^{10}$, $R^{11}$, $R^{12}$, and $R^{13}$ individually represent a linear, branched, or cyclic alkyl group having 1–16 carbon atoms, a linear, branched, or cyclic alkenyl group having 2–16 carbon atoms, an aryl group having 6–15 carbon atoms, or an aralkyl group having 7–12 carbon atoms; or two of $R^{10}$, $R^{11}$, $R^{12}$, and $R^{13}$ form a 5–8 membered heterocyclic structure in combination with the nitrogen atom of the formula (5), and the other two individually represent a linear, branched, or cyclic alkyl group having 1–16 carbon atoms, a linear, branched, or cyclic alkenyl group having 2–16 carbon atoms, an aryl group having 6–15 carbon atoms or an aralkyl group having 7–12 carbon atoms; and $R^{14}$ represents a monovalent hydrocarbon group having 5–16 carbon atoms, an acyl group or carboxyl group having 2–16 carbon atoms, or a group in which a monovalent hydrocarbon group having 1–16 carbon atoms is replaced by a carboxyl group.

2. The radiation-sensitive resin composition according to claim 1, wherein the recurring unit shown by the formula (1) is a recurring unit produced by the cleavage of the polymerizable unsaturated bond of p-hydroxystyrene.

3. The radiation-sensitive resin composition according to claim 1, wherein the copolymer (I) comprises at least one recurring unit produced by the cleavage of the polymerizable unsaturated bond of monomers selected from the group consisting of styrene, p-methylstyrene, t-butoxystyrene, and polyfunctional (meth)acrylates.

4. The radiation-sensitive resin composition according to claim 1, wherein the copolymer (II) comprises at least one recurring unit produced by the cleavage of the polymerizable unsaturated bond of monomers selected from the group consisting of styrene, p-methylstyrene, and polyfunctional (meth)acrylates.

5. The radiation-sensitive resin composition according to claim 1, wherein the group shown by the formula (3) is at least one group selected from the group consisting of a 1,1-dimethyl-3-oxobutyl group, 1,1-diethyl-2-methyl-3-oxopentyl group, 1-(2'-oxocyclohexyl)-1-methylethyl group, 1-methyl-1-ethyl-3-oxopentyl group, and 1-(2-oxopropyl)cyclohexyl group.

6. The radiation-sensitive resin composition according to claim 1, wherein the photoacid generator (b) is selected from the group consisting of onium salt compounds, sulfone compounds, sulfonate compounds, sulfonimide compounds, and diazomethane compounds.

7. The radiation-sensitive resin composition according to claim 1, wherein the cationic moiety ($R^{10}.R^{11}.R^{12}.R^{13}N^+$) of the compound (c) is at least one compound selected from the group the group consisting of tetramethylammonium, tetraethylammonium, tetra-n-propylammonium, tetra-n-butylammonium, tetra-n-pentylammonium, tetra-n-hexylammonium, tetra-n-octylammonium, tetra-n-decylammonium, tetra-n-dodecylammonium, n-hexyl•trimethylammonium,
n-octyl•trimethylammonium, n-nonyl•trimethylammonium,
n-decyl•trimethylammonium, n-dodecyl•trimethylammonium, n-tetradecyl•trimethylammonium, n-hexadecyl•trimethylammonium,
cyclohexyl•trimethylammonium, allyl•trimethylammonium, phenyl•trimethylammonium, 4-t-butylphenyl•trimethylammonium,
benzyl•trimethylammonium, methyl•triethylammonium,
cyclohexyl•triethylammonium, phenyl•triethylammonium, 4-t-butylphenyl•triethylammonium,
benzyl•triethylammonium, benzyl•tri-n-propylammonium, benzyl•tri-n-butylammonium, and methyl•tri-n-octylammonium.

8. The radiation-sensitive resin composition according to claim 1, wherein the anion ($R^{14}COO^-$) of the compound (c) is at least one compound selected from the group the group consisting of hexanoate, heptanoate, octanoate, decanoate, dodecanoate, cyclopentanecarboxylate, cyclohexanecarboxylate, 1-adamantanecarboxylate, 2-(1-adamantyl) acetate, pyruvate, 2-ketobutyrate, oxalate, malonate, succinate, and phthalate.

9. The radiation-sensitive resin composition according to claim 1, further comprising a compound in which a hydrogen atom of an acid functional group is replaced by an acid-decomposable group as a dissolution controller.

10. The radiation-sensitive resin composition according to claim 9, wherein the dissolution controller is bisphenol A, bisphenol F, bisphenol S, 1,1-bis(4-hydroxyphenyl)-1-[4-{1-methyl-1-(4-hydroxyphenyl)ethyl}phenyl]ethane, 4-hydroxyphenylacetic acid, or a compound shown by the following structural formula (8) or (9).

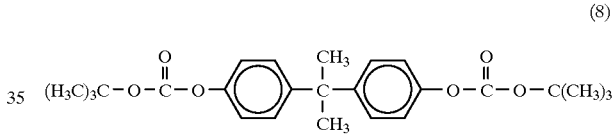

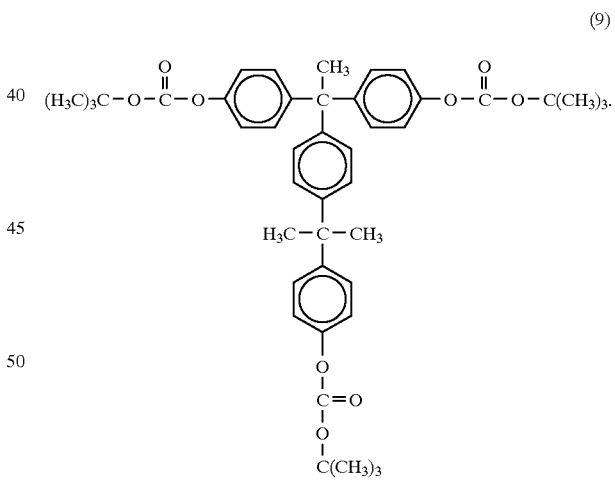

* * * * *